United States Patent
Lee (10) Patent No.: US 8,188,524 B2
(45) Date of Patent: May 29, 2012

(54) CMOS IMAGE SENSOR WITH WIDE DYNAMIC RANGE

(75) Inventor: Won-Ho Lee, Chungcheongbuk-do (KR)

(73) Assignee: Intellectual Ventures II LLC, Wilmington, DE (US)

( * ) Notice: Subject to any disclaimer, the term of this patent is extended or adjusted under 35 U.S.C. 154(b) by 702 days.

(21) Appl. No.: 11/646,235

(22) Filed: Dec. 28, 2006

(65) Prior Publication Data

US 2007/0152247 A1   Jul. 5, 2007

(30) Foreign Application Priority Data

Dec. 29, 2005  (KR) .................. 10-2005-0134125

(51) Int. Cl.
*H01L 31/062* (2006.01)
*H01L 31/113* (2006.01)
(52) U.S. Cl. .................... 257/292; 257/291
(58) Field of Classification Search ......... 257/290–292, 257/E27.132, E27.133
See application file for complete search history.

(56) References Cited

U.S. PATENT DOCUMENTS

| | | | |
|---|---|---|---|
| 6,437,635 B1 | 8/2002 | Watanabe | |
| 6,465,819 B2 | 10/2002 | Furumiya | ............... 257/215 |
| 6,855,937 B2 | 2/2005 | Tashiro et al. | |
| 7,012,645 B1* | 3/2006 | Tsai | ............... 348/308 |
| 7,692,226 B2* | 4/2010 | Lee | ............... 257/292 |
| 2002/0190215 A1* | 12/2002 | Tashiro et al. | ....... 250/370.11 |
| 2005/0127457 A1* | 6/2005 | Roh et al. | ............... 257/392 |

FOREIGN PATENT DOCUMENTS

| | | |
|---|---|---|
| JP | 03-220881 | 9/1991 |
| JP | 05-300432 | 11/1993 |
| JP | 08-306908 | 11/1996 |
| JP | 10-117306 | 5/1998 |
| JP | 2000-224496 | 8/2000 |
| JP | 2000-278608 | 10/2000 |
| JP | 2000-312024 | 11/2000 |
| JP | 2000-329616 | 11/2000 |
| JP | 2002-271698 | 9/2002 |
| JP | 2002-344809 | 11/2002 |
| KR | 2000/0017523 A | 3/2000 |
| KR | 20050061311 A | 6/2005 |
| KR | 10-2005-0079574 | 8/2005 |

* cited by examiner

*Primary Examiner* — Hung Vu
(74) *Attorney, Agent, or Firm* — McAndrews, Held & Malloy Ltd.

(57) ABSTRACT

The present invention relates a CMOS (Complementary Metal Oxide Semiconductor) image sensor capable of improving dynamic range by using an additional driver transistor. The CMOS image sensor according to the present invention has a pixel array which has a plurality of unit pixels each of which includes a photodiode and a fist transistor to act as a source follower buffer amplifier to amplify photogenerated charges accumulated in the photodiode. Also, the CMOS image sensor includes a second transistor for a buffer amplifier to amplify and output a gate input voltage in the unit pixel, wherein an output signal of the first transistor is applied to a gate of the second.

19 Claims, 14 Drawing Sheets

CMOS IMAGE SENSOR WITH WIDE DYNAMIC RANGE

CROSS-REFERENCE TO RELATED APPLICATIONS

The present invention claims priority of Korean patent application number 10-2005-0134125, filed on Dec. 29, 2005, which is incorporated by reference in its entirety.

BACKGROUND OF THE INVENTION

The present invention relates to a semiconductor device; and, more particularly, to a Complementary Metal Oxide Semiconductor (CMOS) image sensor.

Recently, with development of multimedia communication via internet, the demand on digital cameras is dramatically increased. Furthermore, as the supply of the mobile communications terminals such as a Personal Digital Assistant (PDA), an International Mobile Telecommunications-2000 (IMT-2000) cellular phones, and a Code Division Multiple Access (CDMA) terminal is increased, the demand of the small-sized camera modules is increased. Most camera modules basically include an image sensor. Generally, the image sensor is a device to convert optical image into an electrical signal, and a charge coupled device (hereinafter, referred to as "CCD") and a Complementary Metal-Oxide-Semiconductor (CMOS) image sensor are widely used as the image sensor.

The driving method of the CCD is complicated and high power consumption is required. Further, the CCD is required to take lots of mask processes and has the disadvantages in that it is difficult to implement one-chip integration of the signal processing circuits. Recently, the CMOS image sensor has been occupied the attention of the image sensor techniques because it is relatively easy to implement the monolithic integration of the signal processing circuits including a controller and a driver. Moreover, the CMOS image sensor can be manufactured with the cost-effective circuit implementation in the low-power operation, low power consumption, the compatibility with other peripheral circuits and standardized fabrication processes.

However, in the CMOS image sensor, the analog signal generated by a light receiving element, for example, a photo diode is generated with various parasitic effects caused by a parasitic capacitance, a resistance, an inconsistency of a semiconductor device characteristic, a dark current leakage and so on. Since the parasitic effects are inevitably generated in the semiconductor device, they bring about degradation of the signal-to-noise of the image data. Therefore, the noise is a critical factor to limit the performance of the CMOS image sensor.

The noises caused in the CMOS image sensor can be classified into the kT/C noise related to the image data sampling, the 1/f noise related to a circuit which is used for amplifying the image signal and the fixed pattern noise (hereinafter, referred to as FPN) related to an inconsistency of the signal processing circuits of a sensor. The FPN of them is not very good to a visual since it appears in the picture on which peoples can directly recognize the noise as a strip or perpendicular line.

Figure 1:
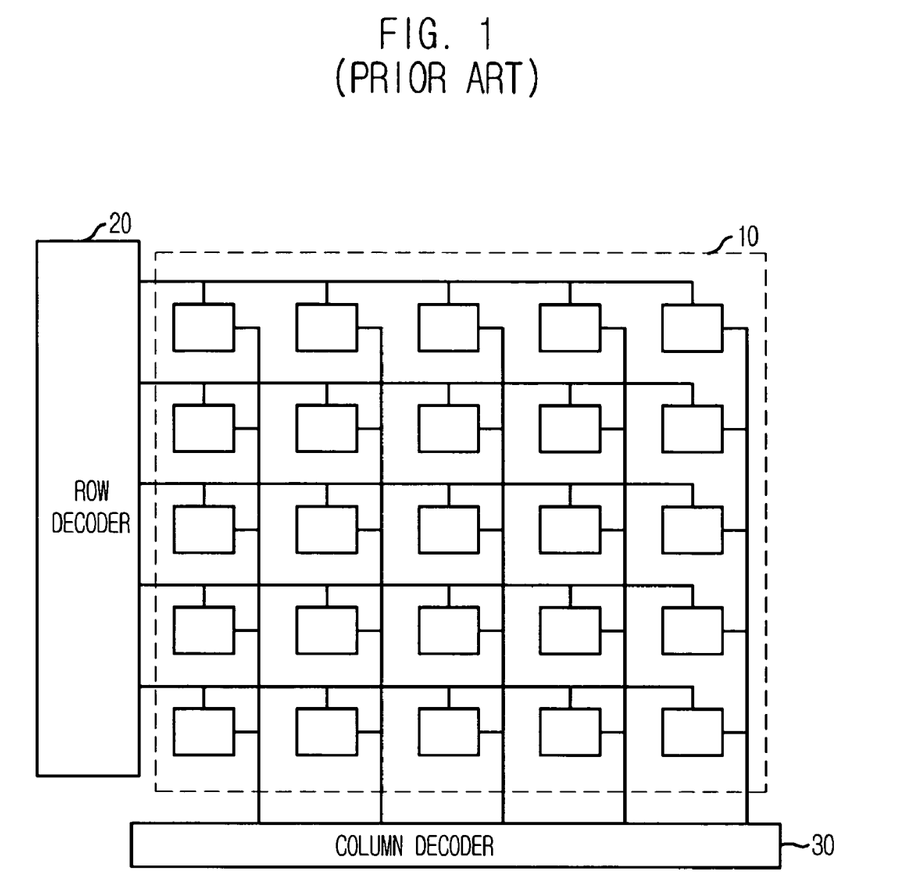
FIG. 1 is a block diagram illustrating a conventional CMOS image sensor.

FIG. 1 is a block diagram illustrating a conventional CMOS image sensor having a rectangular unit pixel structure. Referring to FIG. 1, in the case where a row address signal is applied to a decoder with a pixel array 10 as the central figure, a row decoder 20 is disposed in one direction of the pixel array 10, a pixel data output is disposed at right angles with the row decoder 20, and a column decoder 30 producing a column address signal of the pixel is also disposed centering around the pixel array 10.

The data read-out procedure of the CMOS image sensor in FIG. 1 will be descried. First, data is read out from one pixel by selecting both a first row which is selected by the row decoder 20 and a first column which is selected by the column decoder 30 and, thereafter, the read-out data is amplified. Next, a second row is selected by the row decoder 20, a second column is selected by the column decoder 30, and data of another pixel is read out and amplified. In such a manner that the pixel is selected by the row and column decoders 20 and 30, the whole pixels are read out and amplified one by one. The CMOS image sensor has the various kinds of unit pixels. The general unit pixels are formed in two types of 3-T (transistors) and 4-T structures. The 3-T structure has one photodiode and three transistors and the 4-T structure has one photodiode and four transistors.

Figure 2:
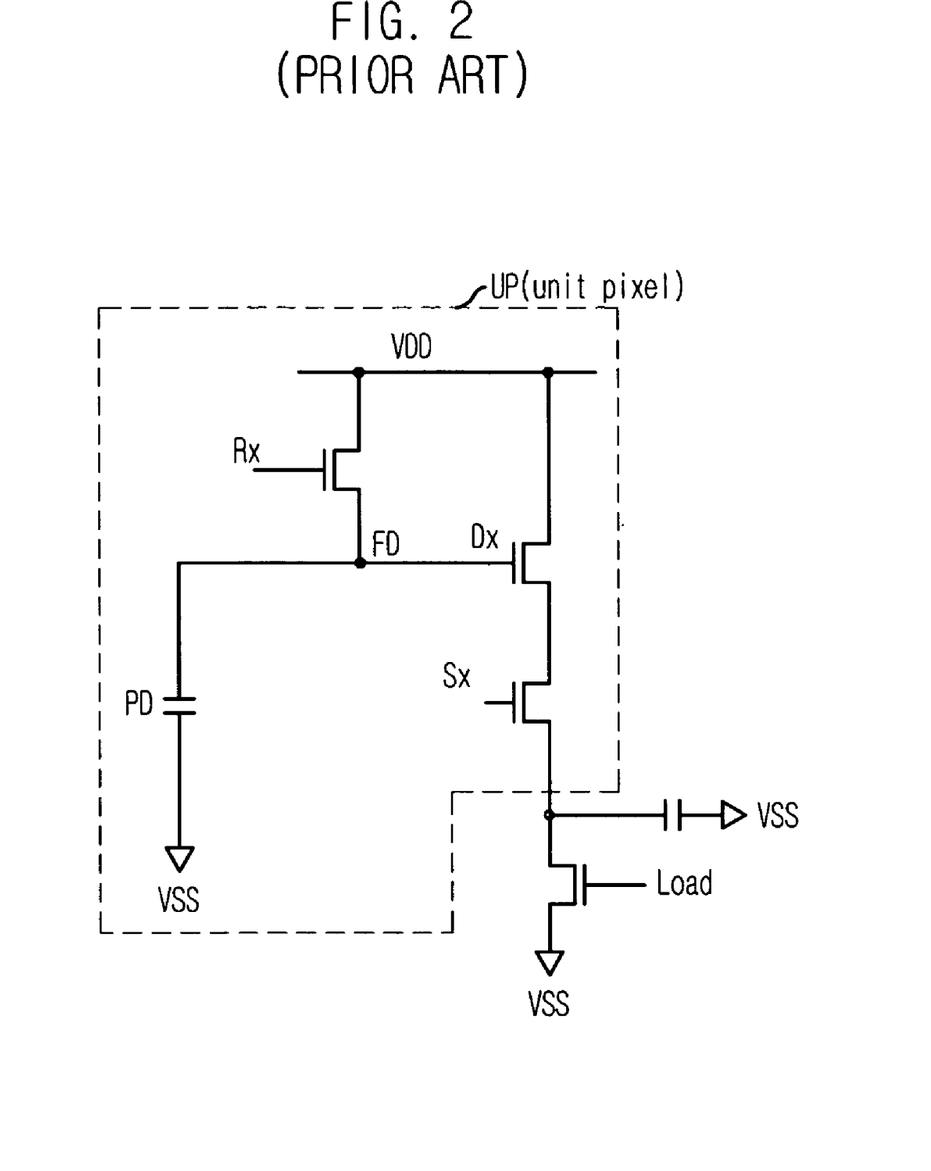
FIG. 2 is a circuit diagram illustrating a unit pixel having a 3-T structure of the conventional CMOS image sensor.

FIG. 2 is a circuit diagram illustrating the 3-T structure of the CMOS image sensor. Referring to FIG. 2, the pixel in the 3-T structure has one photodiode to convert photogenerated charges into an electric signal and three NMOS transistors to process this electric signal. The three transistors are called a reset transistor Rx, a drive transistor Dx and a select transistor Sx, respectively. The reset transistor Rx resets the photodiode connected to a ground voltage by applying a power supply voltage VDD to one end of the photodiode. The drive transistor Dx forms a source follower which acts as a buffer amplifier and the select transistor Sx acts as a switch for addressing the pixel.

Figure 4:
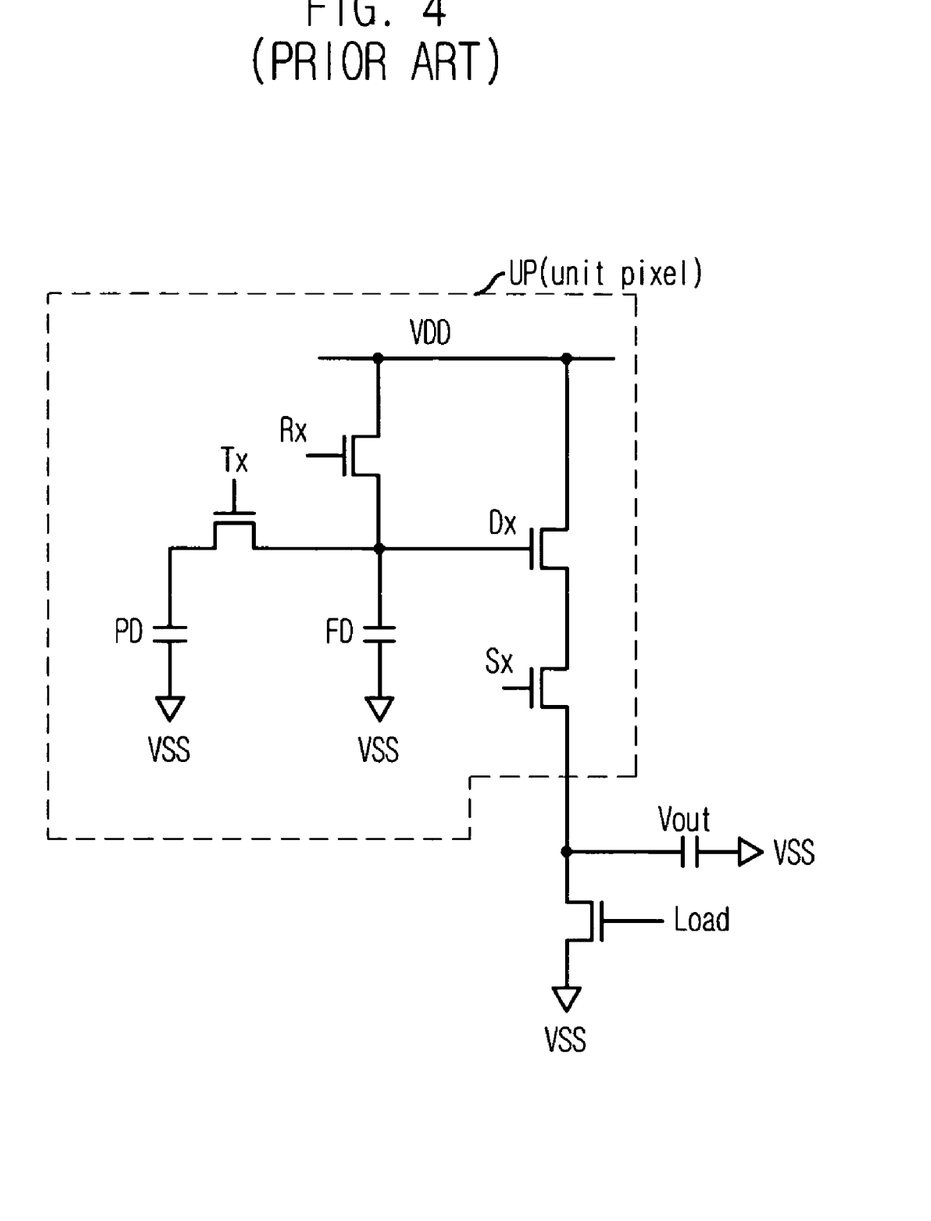
FIG. 4 is a circuit diagram illustrating a unit pixel having a 4-T structure of the conventional CMOS image sensor.

FIG. 4 is a circuit diagram illustrating the 4-T structure of the CMOS image sensor. Referring to FIG. 4, the pixel in the 4-T structure has one photodiode to convert photogenerated charges into an electric signal and four NMOS transistors to process this electric signal. The four transistors are called a transfer transistor Tx, a reset transistor Rx, a drive transistor Dx and a select transistor Sx, respectively. The transfer transistor Tx transfers photogenerated charges in the photodiode to a floating diffusion region FD and the reset transistor Rx sets a potential of the floating diffusion region FD to a predetermined value and then resets the floating diffusion region FD. The drive transistor Dx, as a source follower, acts as a buffer amplifier based on the accumulated charges on the floating diffusion region FD. In similar to the 3-T structure, the select transistor Sx in the 4-T structure acts as a switch for addressing the pixel.

The most important difference between the 3-T and 4-T structures is the presence of the transfer transistor Tx and the floating diffusion region FD. The 3-T structure turns on the reset transistor Rx after detecting a reset level of the unit pixel; however, the 4-T structure detects the signal level by turning on the transfer transistor Tx after detecting the reset level by turning on the reset transistor Rx.

Figure 3:
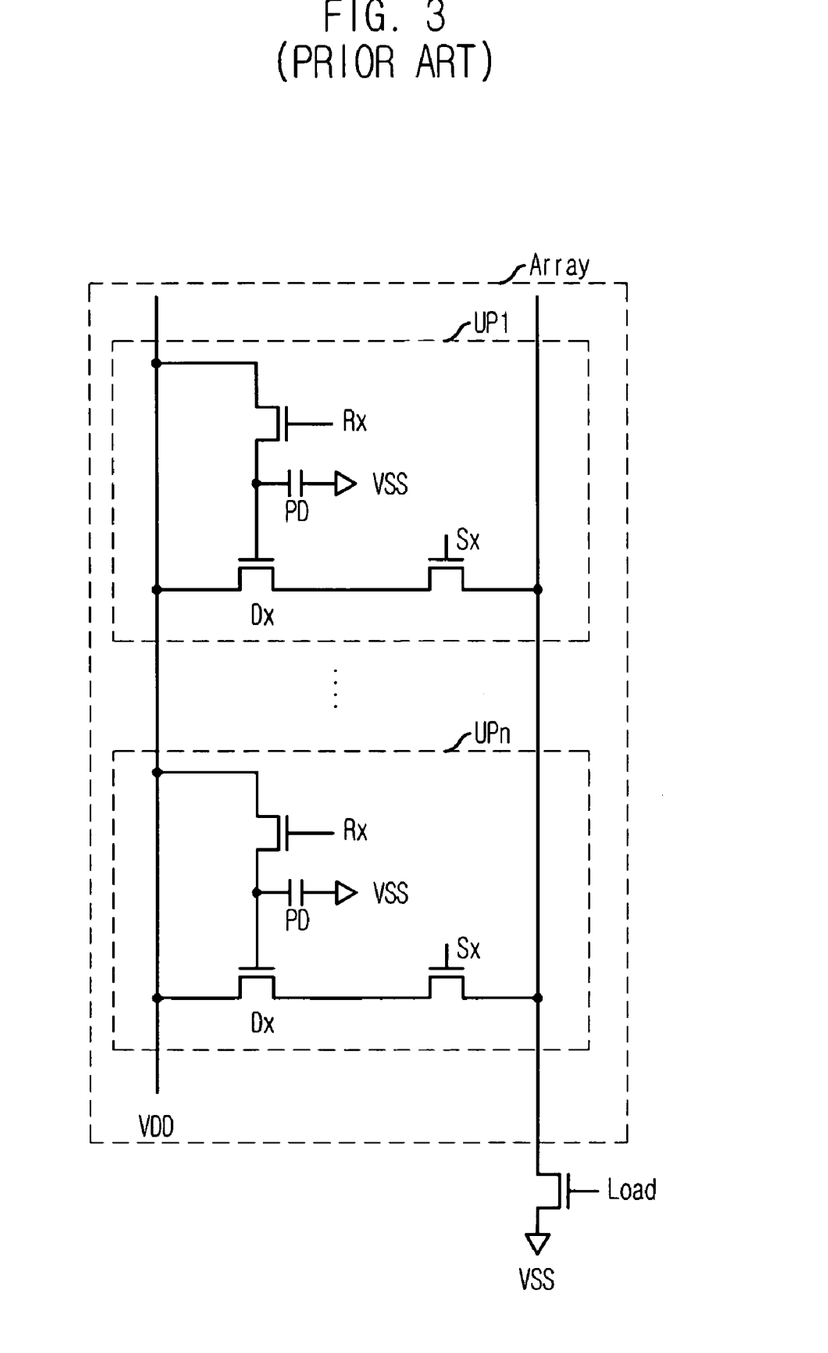
FIG. 3 is a circuit diagram illustrating a pixel array having a plurality of the unit pixel of FIG. 2.

FIG. 3 is a circuit diagram illustrating a pixel array in which one column line is commonly owned by a plurality of pixels in the 3-T structure. As shown in FIG. 3, the unit pixels UP1 to UPn are commonly connected to one column line and then connected to one load transistor.

Figure 5:
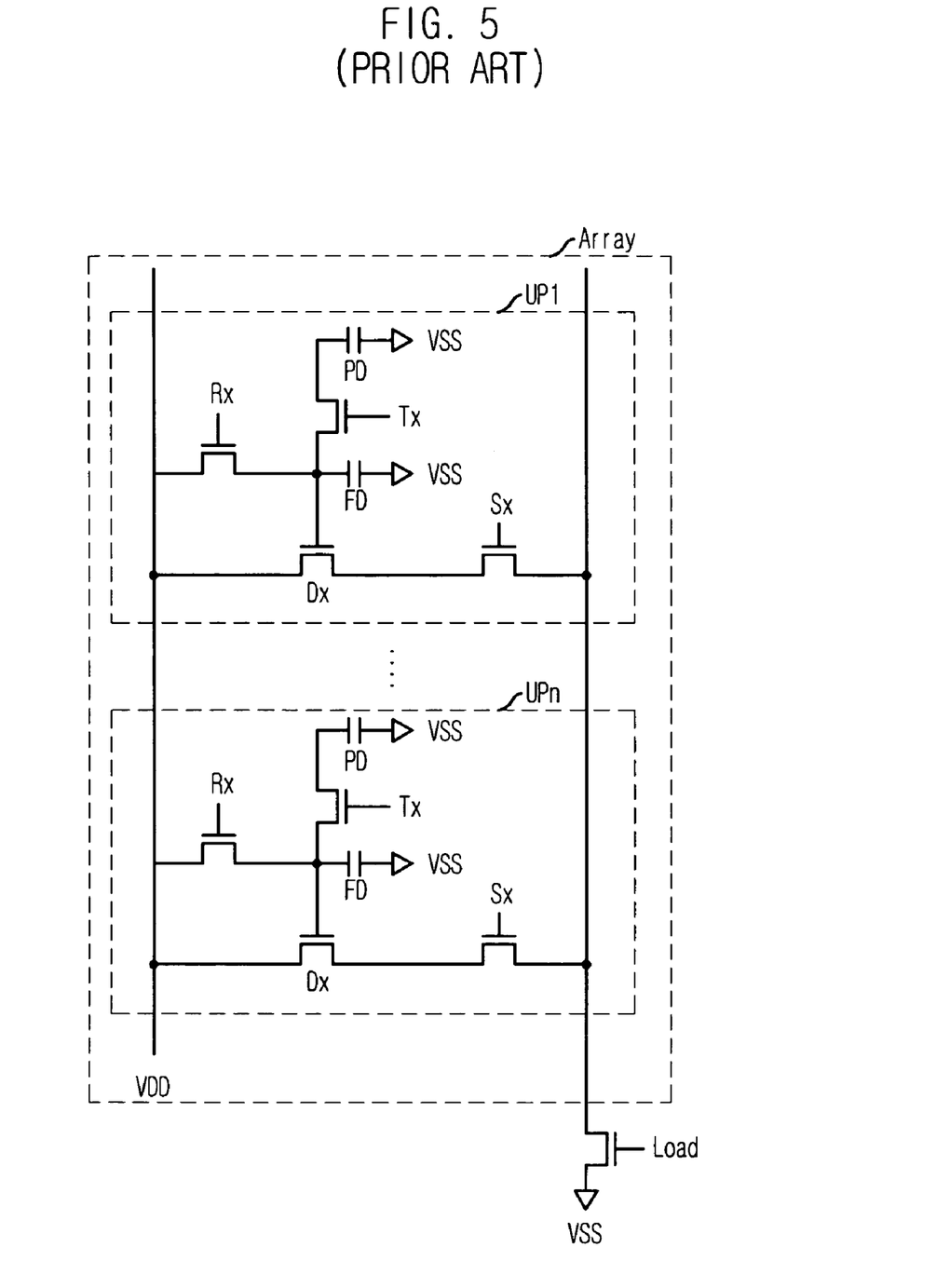
FIG. 5 is a circuit diagram illustrating a pixel array having a plurality of the unit pixel of FIG. 4.

FIG. 5 is a circuit diagram illustrating the pixel array in which the pixels of the 4-T structure are commonly connected to one column line. Referring to FIG. 5, the unit pixels UP1 to UPn are commonly connected to one column line and connected to one load transistor.

As shown in FIGS. 3 and 5, in the 3-T and 4-T structures, a plurality of pixels are commonly connected to one column line and connected to one load transistor through the column line. The data are outputted on a column-by-column basis as shown in FIG. 1.

The CMOS image sensor having these characteristics and configuration has the disadvantage in that the dynamic range of the CMOS image sensor is lower than that of the CCD (approximately, a half (½)). The dynamic range means the rate of the saturation level of the pixel to the signal noise level and it is the significance factor to determine the chroma of the color.

If approximately 20 million electrons are detected at the saturation and approximately 40 electrons are detected at the noise, the dynamic range is about 5000 and the noise is −75 dB. Since the variation of the transistors which is employed for converting the photogenerated charges into a voltage level has an effect on the output characteristics of CMOS image sensor, the CMOS image sensor has the disadvantage in the dynamic range, as compared with the CCD.

SUMMARY OF THE INVENTION

Embodiments of the present invention are directed to provide a CMOS image sensor capable of improving the dynamic range thereof.

In accordance with an aspect of the present invention, there is provided a CMOS image sensor having a pixel array having a plurality of unit pixels each of which includes a photodiode and a fist transistor to act as a source follower buffer amplifier to amplify photogenerated charges accumulated in the photodiode, the CMOS image sensor comprising a second transistor for a buffer amplifier to amplify and output a gate input voltage in the unit pixel, wherein an output signal of the first transistor is applied to a gate of the second transistor.

In accordance with another aspect of the present invention, there is provided a CMOS image sensor having a pixel array having a plurality of unit pixels each of which includes a photodiode and a fist transistor to act as a source follower buffer amplifier to amplify photogenerated charges accumulated in the photodiode, wherein the plurality of unit pixels are connected to a common column line, the CMOS image sensor comprising a second transistor having a gate which receives one of output signals from the first transistors in the plurality of unit pixels, wherein the second transistor amplifies the output signal inputted from the gate and outputs the amplified signal to the common column line.

DESCRIPTION OF SPECIFIC EMBODIMENTS

An object of the present invention is to a CMOS image sensor to improve the dynamic range.

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Embodiment 1

Figure 6:
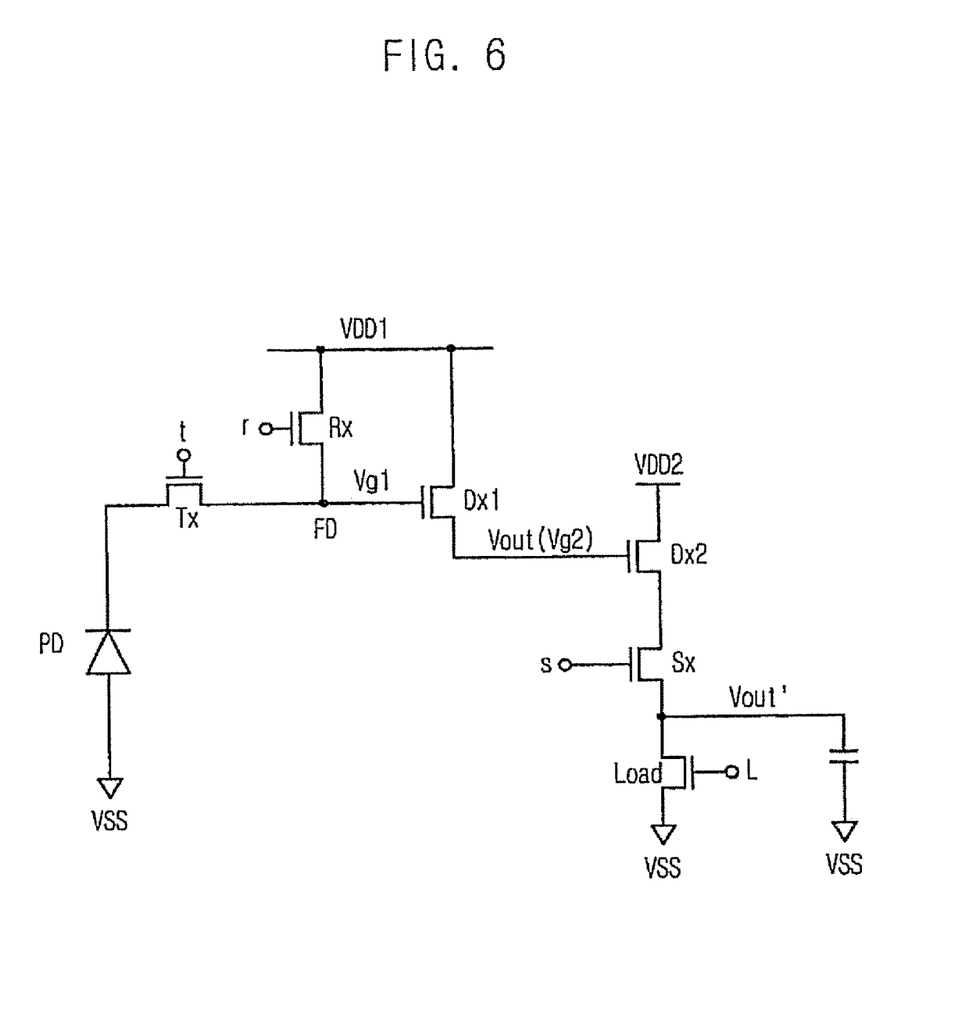
FIG. 6 is a circuit diagram illustrating a unit pixel of a CMOS image sensor according to a first embodiment of the present invention.
Figure 7:
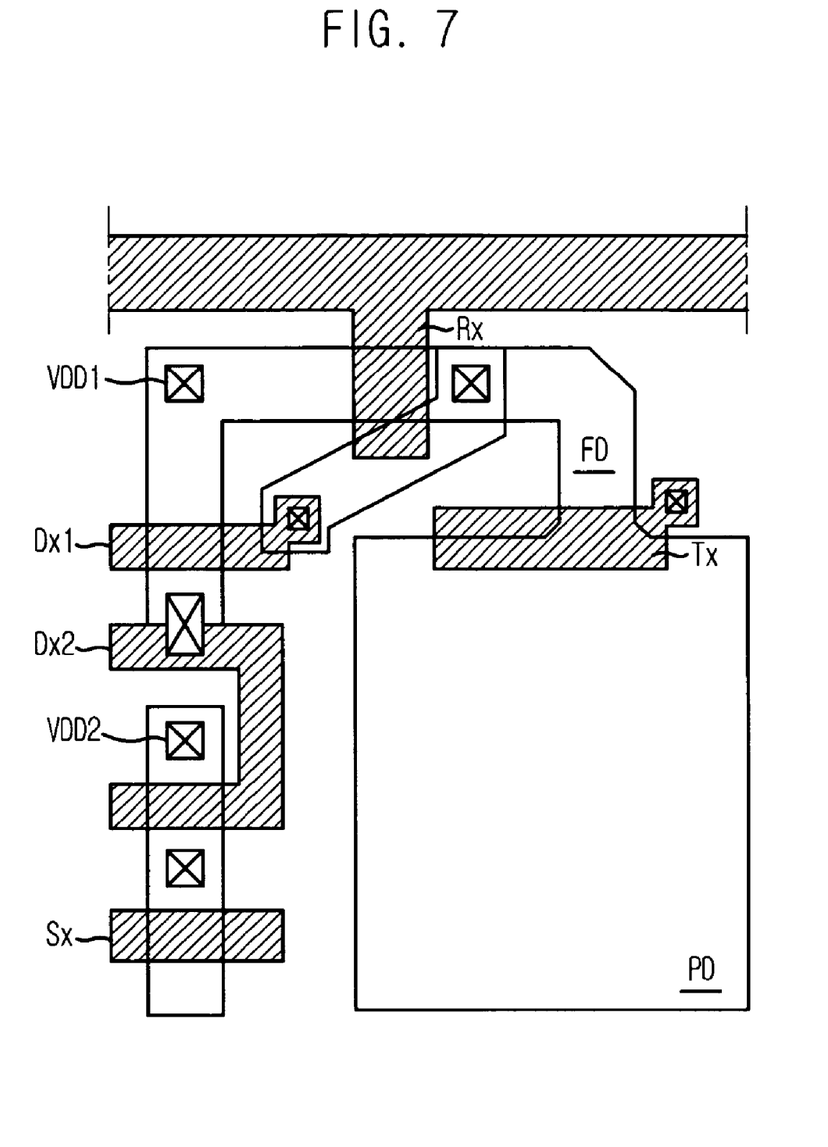
FIG. 7 is a layout of the unit pixel of FIG. 6.

FIG. 6 is a circuit diagram illustrating a unit pixel having the 4-T structure of a CMOS image sensor according to a first embodiment of the present invention and FIG. 7 is a layout of the unit pixel of FIG. 6.

Referring to FIGS. 6 and 7, in the unit pixel according to the first embodiment 1 of the present invention, driver transistors which act as a buffer amplifier using a source follower are provided at two stages. That is, besides a first driver transistor Dx1, an additional driver transistor, a second driver transistor Dx2, which is connected between a second power supply voltage VDD2 and the drain of the select transistor Sx and has a gate to be connected to a source of the first driver transistor Dx1, is further provided to the unit pixel. In this configuration, the width of voltage swing of the transistor is increased with wide dynamic range. In order to increase the width of voltage swing, the second power supply voltage VDD2 is preferably higher than a first power supply voltage VDD1.

Figure 8A:
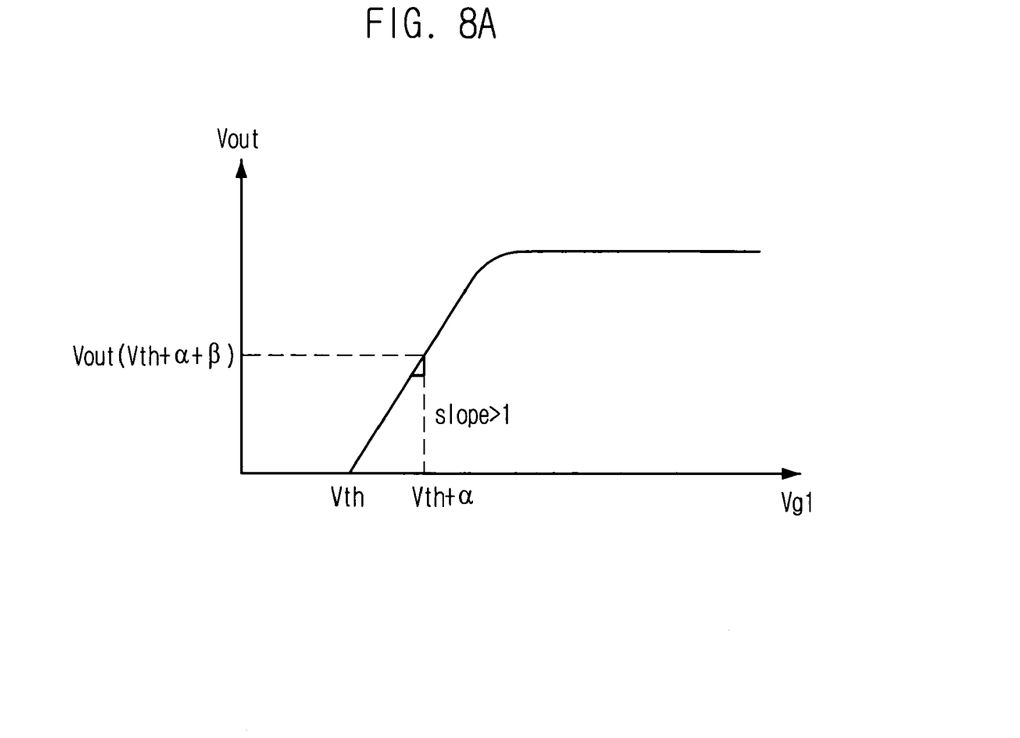
FIGS. 8A, 8B and 9 are timing charts illustrating an operation of the unit pixel of FIG. 6.
Figure 8B:
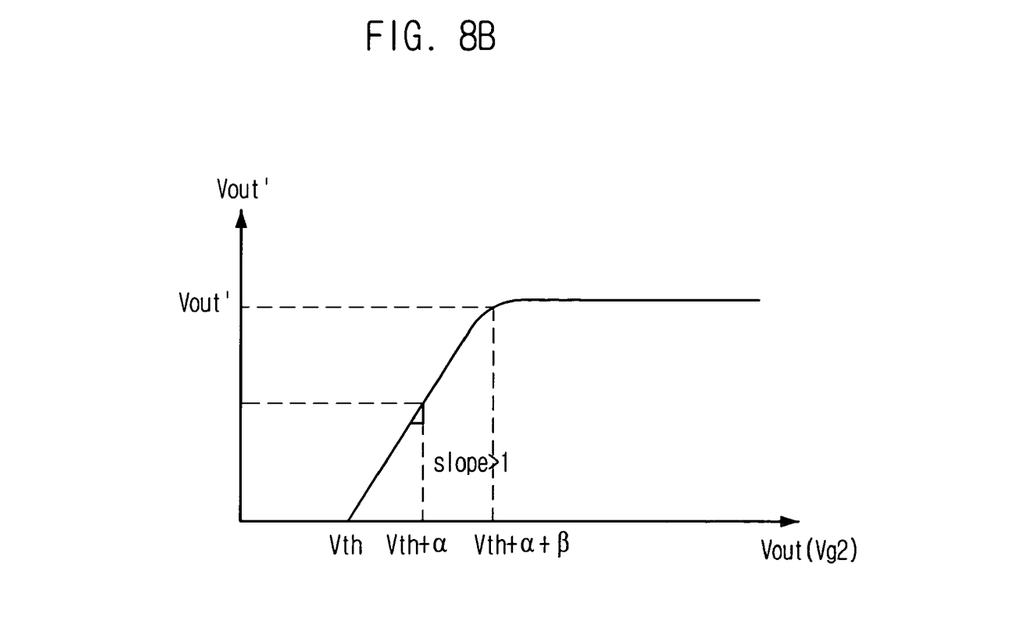

FIGS. 8A and 8B are graphs illustrating the dynamic range enlarged by the unit pixel having the structure according to the first embodiment of the present invention shown in FIG. 6. The graph shown in FIG. 8A is an operation waveform of the first drive transistor Dx1 and the graph shown in FIG. 8B is an operation waveform of the second drive transistor Dx2. Moreover, the threshold voltage of the second drive transistor Dx2 is the same as that of the first drive transistor Dx1.

Figure 9:
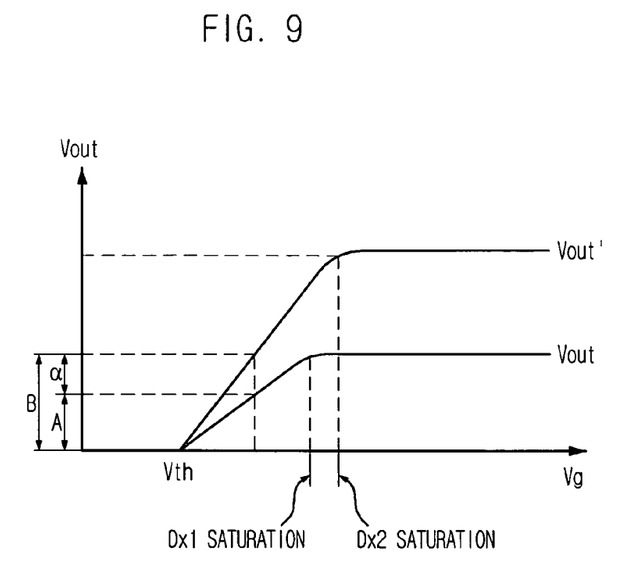

As shown in FIG. 9, the dynamic range is increased when two drive transistors Dx1 and Dx2 are used in the invention, as compared with the conventional CMOS image sensor using just one drive transistor Dx1. That is, the second drive transistor Dx2 receives an output signal Vout of the first drive transistor Dx1 through a gate thereof so that the dynamic range is increased based on such a gate input Vg2.

Referring to FIG. 9 showing the operation characteristics of the first and second driver transistors, the dynamic range B of the CMOS image sensor having two diver transistors Dx1 and Dx2 is wider than that having just one driver transistor by +α. That is, the first drive transistor Dx1 receives a gate voltage Vg1 and outputs an amplified output signal Vout and the output signal Vout from the first driver transistor Dx1 is inputted into a gate of the second driver transistor Dx2 as a gate input signal. The final output signal Vout' is higher than the output signal Vout of the first driver transistor Dx1 and the saturation caused by the body effect is delayed as shown in FIG. 9.

Embodiment 2

Figure 10:
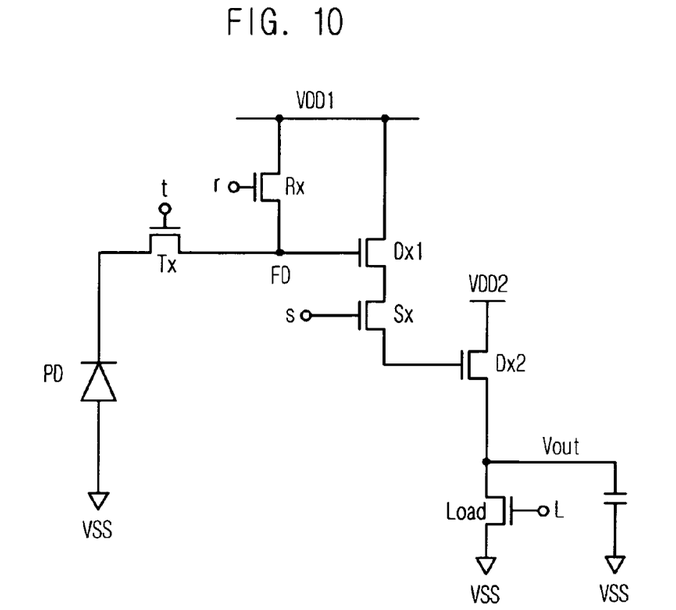
FIG. 10 is a circuit diagram illustrating a pixel array of a CMOS image sensor according to a second embodiment of the present invention.

FIG. 10 is a circuit diagram illustrating a unit pixel of the image sensor having the 4-T structure according to a second embodiment of the present invention. Referring to FIG. 10, in the unit pixel according to the second embodiment of the present invention, the select transistor Sx is connected between the first and second driver transistors Dx1 and Dx2. That is, the second driver transistor Dx2 is connected between the second power supply voltage VDD2 and the output signal Vout and a gate of the second driver transistor Dx2 is connected to a source of the select transistor Sx. The first driver transistor Dx1 is connected between the first power supply voltage VDD1 and the select transistor Sx and the gate of the first driver transistor Dx1 is connected to the floating diffusion region FD. Other elements in this embodiment are the same as those in the first embodiment of the present invention.

Embodiment 3

Figure 11:
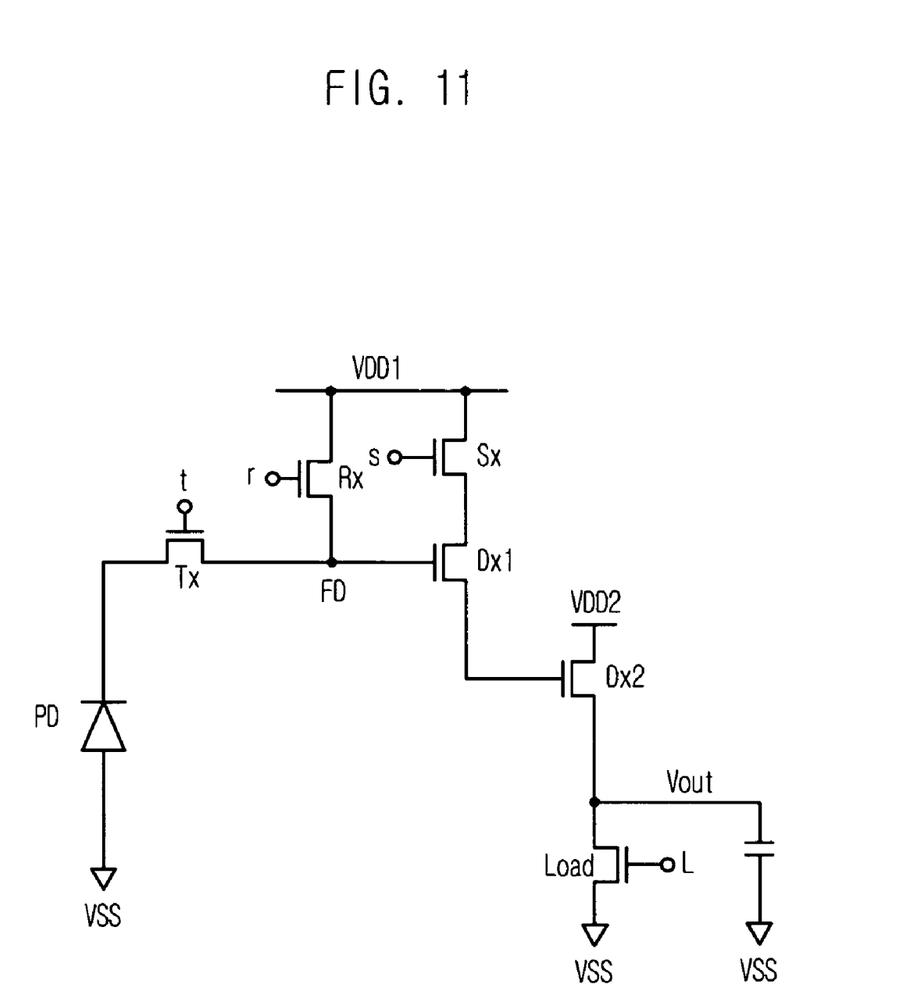
FIG. 11 is a circuit diagram illustrating a pixel array of a CMOS image sensor according to a third embodiment of the present invention.

FIG. 11 is a circuit diagram illustrating a unit pixel of the image sensor having the 4-T structure according to a third embodiment of the present invention. Referring to FIG. 11, in the unit pixel according to the third embodiment of the present invention, the select transistor Sx is connected between the first power supply voltage VDD1 and a drain of the first driver transistor Dx1. Other elements in this embodiment are the same as those in the first embodiment of the present invention.

Embodiment 4

Figure 12A:
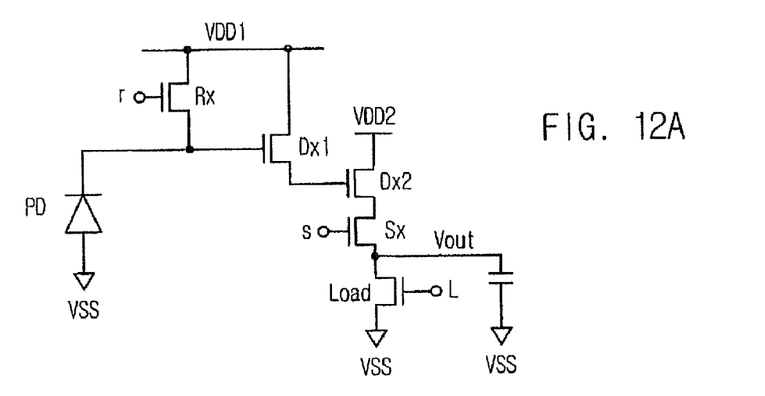
FIGS. 12A to 12C are a circuit diagram illustrating a pixel array of a CMOS image sensor according to a fourth embodiment of the present invention.
Figure 12B:
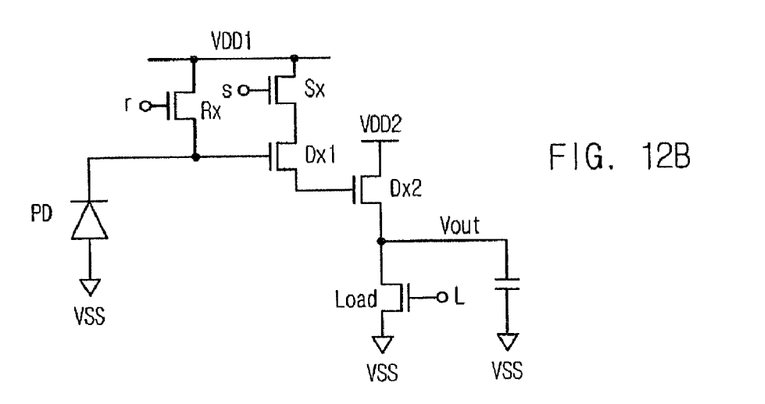
Figure 12C:
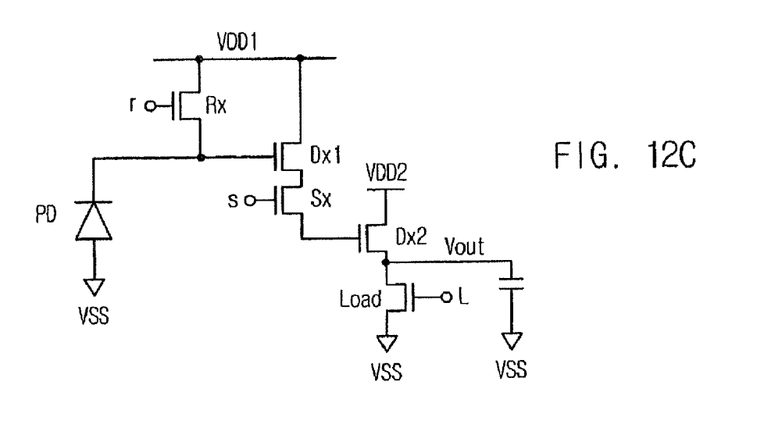

FIGS. 12A to 12C are circuit diagrams illustrating unit pixels of the image sensor having the 3-T structure according to a fourth embodiment of the present invention. Referring to FIGS. 12A to 12C, the fourth embodiment of the present invention shows the unit pixels when the 3-T structure is respectively applied to the first to third embodiments.

Embodiment 5

Figure 13:
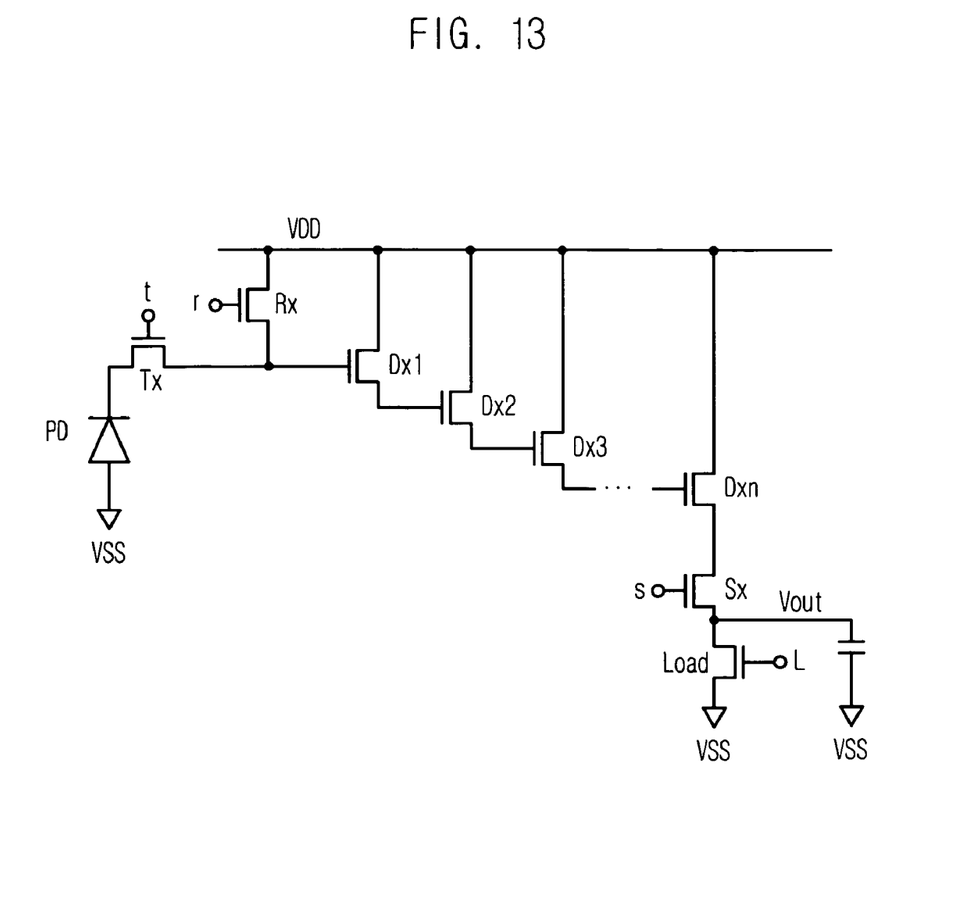
FIG. 13 is a circuit diagram illustrating a pixel array of a CMOS image sensor according to a fifth embodiment of the present invention.

FIG. 13 is a circuit diagram illustrating a unit pixel of the image sensor having the 4-T structure according to a fifth embodiment of the present invention. Referring to FIG. 13, being different from the first embodiment having the two-stage structure of the first and second driver transistors Dx1 and Dx2, the unit pixel according to the fifth embodiment of the present invention has a multiple stage Dxn of the driver transistors and uses one power supply voltage as a common drain voltage.

Embodiment 6

Figure 14:
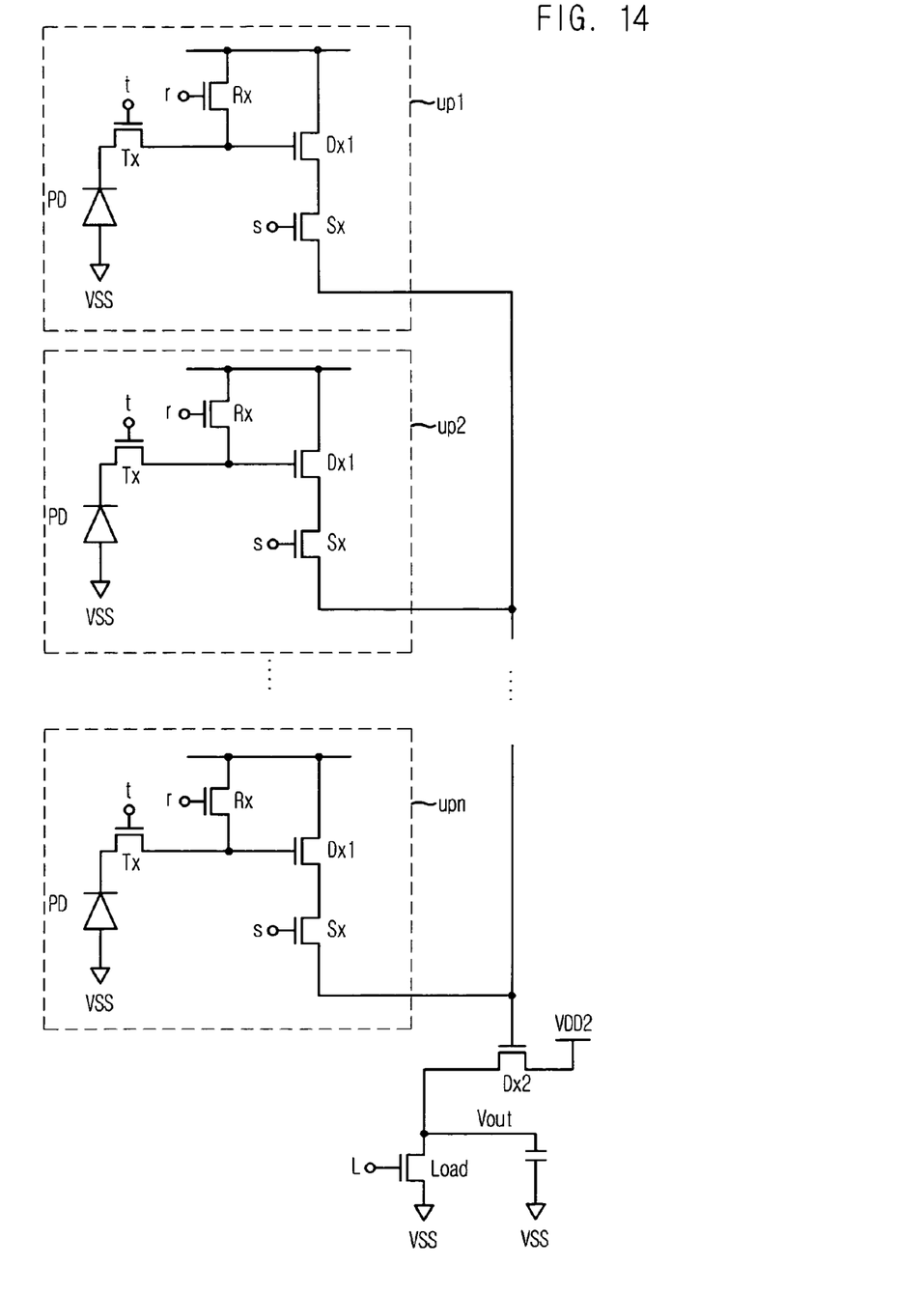
FIG. 14 is a circuit diagram illustrating a pixel array of a CMOS image sensor according to a sixth embodiment of the present invention.

FIG. 14 is a circuit diagram illustrating a unit pixel of the image sensor having the 4-T structure according to a sixth embodiment of the present invention. Referring to FIG. 14, being different from the first to fifth embodiments having two stage structure of the first and second driver transistors Dx1 and Dx2, the unit pixel according to the sixth embodiment of the present invention has the second driver transistor Dx2 every column line in order to reduce the fill factor. That is, each of the unit pixels UP1 to UPn has one drive transistor Dx1 and additionally comprises the second drive transistor Dx2 on a column-by-column basis. This configuration can increase the dynamic range without the reduction of the fill factor.

Embodiment 7

Figure 15:
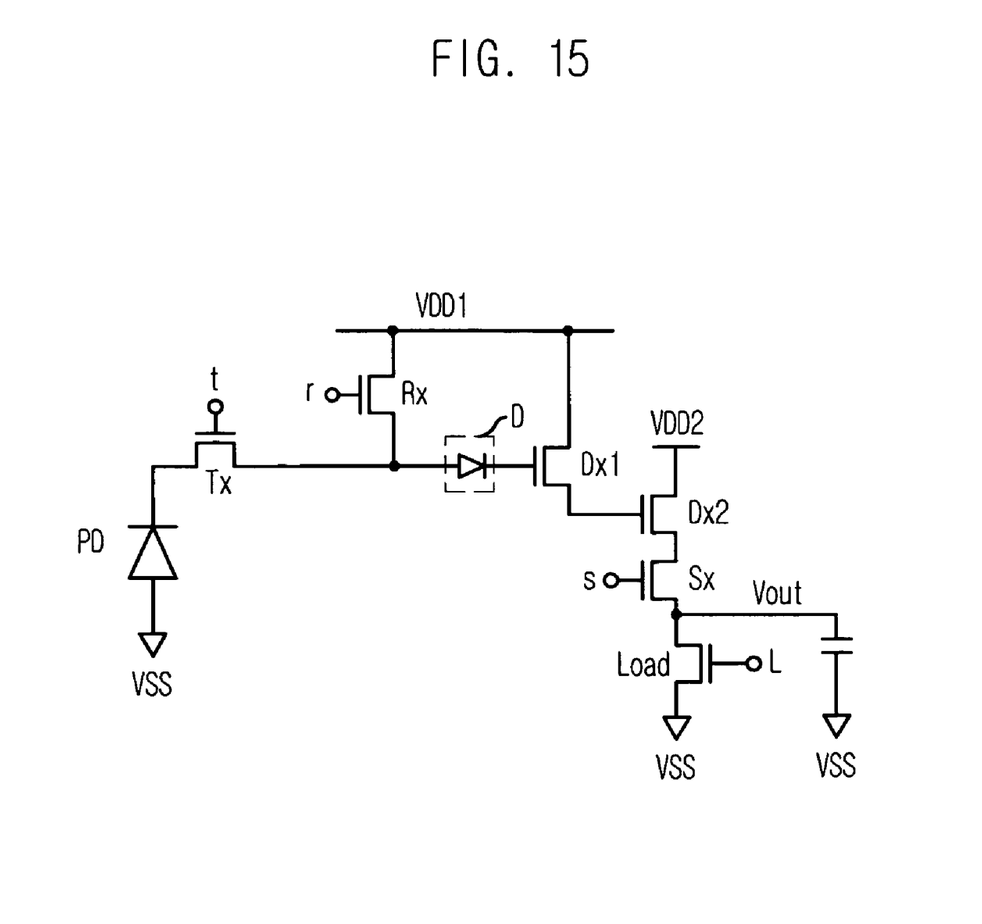
FIG. 15 is a circuit diagram illustrating a pixel array of a CMOS image sensor according to a seventh embodiment of the present invention.

FIG. 15 is a circuit diagram illustrating the unit pixel of the image sensor having the 4-T structure according to a seventh embodiment of the present invention. Referring to FIG. 15, the unit pixel according to the seventh embodiment of the present invention further includes a diode D to carry out the rectification at the gate terminal of the first drive transistor Dx1 in the unit pixels which are illustrated in the first to sixth embodiments. In similar to the general rectification of a diode, the diode D blocks a negative (−) electric potential and transfers a positive (+) electric potential. In the meantime, the first power supply voltage VDD1 and the second power supply voltage VDD2 illustrated in the first to seventh embodiments are 2.5V and 2.8V, respectively.

While the present invention has been described with respect to the specific embodiments, it will be apparent to those skilled in the art that various changes and modifications may be made without departing from the spirit and scope of the invention as defined in the following claims.

What is claimed is:

1. An image sensor, comprising:
a pixel array having a plurality of unit pixels, each unit pixel of the plurality of unit pixels including:
a photodiode;
a select transistor; and
a first drive transistor configured to act as a source follower buffer amplifier and to amplify photo-generated charges accumulated in the photodiode; and:
a second drive transistor configured to act as a buffer amplifier and to amplify a gate input voltage, wherein an output of the first drive transistor is supplied to a gate of the second drive transistor;
wherein the select transistor of each unit pixel is configured to cause, in response to a respective select signal, the first drive transistor of the respective unit pixel and the second drive transistor to act together to amplify the photo-generated charges accumulated in the photodiode of the respective unit pixel.

2. The image sensor of claim 1, wherein drain voltages of the first and second drive transistors are the same.

3. The image sensor of claim 2, further comprising a diode connected to a gate of the first drive transistor, wherein the diode is configured to rectify the accumulated photo-generated charges in the photodiode.

4. The image sensor of claim 3, further comprising a third transistor having a source connected to a drain of the first drive transistor and a drain connected to a power supply voltage, wherein the third transistor is configured to transfer a drain voltage from the power supply voltage to a drain of the first drive transistor.

5. The image sensor of claim 1, wherein a drain voltage of the first drive transistor is lower than that of the second drive transistor.

6. The image sensor of claim 1, further comprising a third transistor having a drain connected to a source of the second drive transistor and a source connected to a column line, wherein the third transistor is configured to transfer an output signal of the second drive transistor to the column line.

7. The image sensor of claim 1, further comprising a third transistor having a drain connected to a source of the first drive transistor and a source connected to a gate of the second drive transistor, wherein the third transistor is configured to transfer an output signal of the first drive transistor to a gate of the second drive transistor.

8. An image sensor, comprising:
a pixel array having a plurality of unit pixels, wherein each unit pixel of the plurality of unit pixels includes:
a photodiode;
a select transistor; and
a first drive transistor configured to act as a source follower buffer amplifier to amplify photo-generated charges accumulated in the photodiode, wherein the plurality of unit pixels are connected to a common column line; and a second drive transistor having a gate configured to receive output signals from the first drive transistors of the plurality of unit pixels;

wherein the second drive transistor is configured to amplify the output signal input from the gate and output the amplified signal to the common column line; and wherein the select transistor of each unit pixel is configured to cause, in response to a respective select signal, the first drive transistor of the respective unit pixel and the second drive transistor to act together to amplify the photo-generated charges accumulated in the photodiode of the respective unit pixel.

9. The image sensor of claim 8, wherein drain voltages of the first and second drive transistors are the same.

10. The image sensor of claim 9, further comprising a diode connected to a gate of the first drive transistor configured to rectify the accumulated photo-generated charges in the photodiode.

11. The image sensor of claim 10, further comprising a third transistor having a source connected to a drain of the first drive transistor and a drain connected to a power supply voltage, wherein the third transistor is configured to transfer a drain voltage from the power supply voltage to a drain of the first drive transistor.

12. The image sensor of claim 10, further comprising a third transistor having a drain connected to a source of the second drive transistor and a source connected to a column line, wherein the third transistor is configured to transfer an output signal of the second drive transistor to the column line.

13. The image sensor of claim 10, further comprising a third transistor having a drain connected to a source of the first drive transistor and a source connected to a gate of the second drive transistor, wherein the third transistor is configured to transfer an output signal of the first transistor to a gate of the second drive transistor.

14. The image sensor of claim 8, wherein a drain voltage of the first drive transistor is lower than that of the second drive transistor.

15. An image sensor comprising:

a unit pixel including a photodiode, a select transistor, and a first drive transistor configured to amplify photo-generated charges accumulated in the photodiode; and a second drive transistor configured to amplify a gate input voltage, wherein an output of the first drive transistor is supplied to a gate of the second drive transistor;

wherein the select transistor is configured to cause, in response to a select signal, the first drive transistor and the second drive transistor to act together to amplify the photo-generated charges accumulated in the photodiode.

16. The image sensor of claim 15, further comprising a diode connected to a gate of the first drive transistor, wherein the diode is configured to rectify the accumulated photo-generated charges in the photodiode.

17. The image sensor of claim 15, further comprising a third transistor having a source connected to a drain of the first drive transistor and a drain connected to a power supply voltage, wherein the third transistor is configured to transfer a drain voltage from the power supply voltage to a drain of the first drive transistor.

18. The image sensor of claim 15, further comprising a third transistor having a drain connected to a source of the second drive transistor and a source connected to a column line, wherein the third transistor is configured to transfer an output signal of the second drive transistor to the column line.

19. The image sensor of claim 15, further comprising a third transistor having a drain connected to a source of the first drive transistor and a source connected to a gate of the second drive transistor, wherein the third transistor is configured to transfer an output signal of the first drive transistor to a gate of the second drive transistor.

* * * * *

UNITED STATES PATENT AND TRADEMARK OFFICE
CERTIFICATE OF CORRECTION

PATENT NO. : 8,188,524 B2
APPLICATION NO. : 11/646235
DATED : May 29, 2012
INVENTOR(S) : Lee

Page 1 of 1

It is certified that error appears in the above-identified patent and that said Letters Patent is hereby corrected as shown below:

In Column 4, Line 17, in Heading, delete "DESCRIPTION" and insert -- DETAILED DESCRIPTION --, therefor.

In Column 6, Line 24, in Claim 1, delete "and:" and insert -- and --, therefor.

Signed and Sealed this
Ninth Day of October, 2012

David J. Kappos
*Director of the United States Patent and Trademark Office*